United States Patent
Wang et al.

(10) Patent No.: US 10,745,590 B2
(45) Date of Patent: Aug. 18, 2020

(54) PHOTO-CURABLE ADHESIVE COMPOSITION, CURED PRODUCT AND USE THEREOF

(71) Applicant: Henkel AG & Co. KGaA, Duesseldorf (DE)

(72) Inventors: Hongyu Wang, Shanghai (CN); Minghui Liu, Shanghai (CN)

(73) Assignee: Henkel AG & Co. KGaA, Duesseldorf (DE)

( * ) Notice: Subject to any disclaimer, the term of this patent is extended or adjusted under 35 U.S.C. 154(b) by 0 days.

(21) Appl. No.: 16/452,808

(22) Filed: Jun. 26, 2019

(65) Prior Publication Data

US 2019/0316005 A1   Oct. 17, 2019

Related U.S. Application Data

(63) Continuation of application No. PCT/CN2016/112962, filed on Dec. 29, 2016.

(51) Int. Cl.

| C08F 2/46 | (2006.01) |
|---|---|
| C08F 2/50 | (2006.01) |
| C08G 61/04 | (2006.01) |
| C09J 4/06 | (2006.01) |
| C09J 5/00 | (2006.01) |
| C09J 11/08 | (2006.01) |
| C09J 133/10 | (2006.01) |
| H05K 5/03 | (2006.01) |

(52) U.S. Cl.
CPC . *C09J 4/06* (2013.01); *C09J 5/00* (2013.01); *C09J 11/08* (2013.01); *C09J 133/10* (2013.01); *C09J 2205/31* (2013.01); *C09J 2433/00* (2013.01); *C09J 2483/00* (2013.01); *H05K 5/03* (2013.01)

(58) Field of Classification Search
CPC .............. C08F 2/46; C08F 2/50; C08G 61/04

USPC .......................................... 522/99, 1; 520/1
See application file for complete search history.

(56) References Cited

U.S. PATENT DOCUMENTS

| 8,349,706 B2 | 1/2013 | Noda |
| 9,567,499 B2 | 2/2017 | Thiele et al. |
| 10,093,837 B2 | 10/2018 | Lu et al. |
| 2002/0181913 A1* | 12/2002 | Szum ................. C03C 25/1065 385/128 |
| 2015/0166860 A1 | 6/2015 | Yuan et al. |
| 2017/0253780 A1* | 9/2017 | Wang ....................... B32B 7/12 |

FOREIGN PATENT DOCUMENTS

| CN | 1883044 | 12/2006 |
| CN | 102485822 | 6/2012 |
| CN | 103314027 | 9/2013 |
| CN | 103554429 | 2/2014 |
| CN | 104768731 | 7/2015 |
| CN | 104812858 | 7/2015 |
| WO | 2013013568 | 1/2013 |
| WO | 2016077984 | 5/2016 |

OTHER PUBLICATIONS

International Search Report issued in connection with International Patent Application No. PCT/CN2016/112962 dated Sep. 28, 2017.
ASTM D2240.
ASTM D1003-2007.
ASTM D1084.
ASTM D903.

* cited by examiner

*Primary Examiner* — Jessica Whiteley
(74) *Attorney, Agent, or Firm* — Steven C. Bauman

(57) ABSTRACT

The present disclosure relates to a photo-curable adhesive composition and the cured product thereof. The photo-curable adhesive composition according to the present disclosure comprises hydrophobic urethane (meth)acrylate polymers; a (meth)acrylate monomer or (meth)acrylamide monomer; a photoinitiator and a slip agent. The photo-curable adhesive composition according to the present disclosure exhibits good peelable property and optical property.

19 Claims, No Drawings

PHOTO-CURABLE ADHESIVE COMPOSITION, CURED PRODUCT AND USE THEREOF

TECHNICAL FIELD

The present disclosure relates to a photo-curable adhesive composition and the cured product thereof. The photo-curable adhesive composition according to the present disclosure comprises hydrophobic urethane (meth)acrylate polymers; a (meth)acrylate monomer or (meth)acrylamide monomer; a photoinitiator and a slip agent. The photo-curable adhesive composition according to the present disclosure exhibits good peelable property and optical property.

BACKGROUND OF THE INVENTION

During assembling and processing electronic devices (such as smartphones, tablet computers and monitors), temporary bonding tapes are usually used to protect the exposed surfaces of the electronic devices from being scratched. However, tapes cannot easily conform to the 3D-shapes of the electronic devices, especially the corners of the outer shells.

Solvent-based or waterborne adhesives can offer another solution to form temporary protective films. However, traditional solvent based adhesives are not environmentally friendly. Furthermore, it takes time to evaporate the solvents during film formation, and thus it is not an efficient way of working.

For traditional waterborne adhesives, heat curing is typically required after applying the adhesives onto the surfaces of electronic devices. The heating process might cause unexpected damages to the sensitive electronic devices. Further, it also takes a long time to cure or to evaporate the water, thus the overall efficiency is relatively low and cannot meet the requirement of rapid assembling. Moreover, if the waterborne based adhesive is applied onto metal surfaces, vapour corrosion is a big concern.

Therefore, there is an ongoing need for developing a solvent free liquid adhesive suitable to form a temporary protective film for the surfaces of electronic devices during assembling or processing.

SUMMARY OF THE INVENTION

After intensive study, the inventors have developed a novel photo-curable adhesive composition, comprising:
a) a hydrophobic urethane (meth)acrylate polymer A having a weight average molecular weight of 35000 to 60000 g/mol;
b) a hydrophobic urethane (meth)acrylate polymer B having a weight average molecular weight of 5000 to 25000 g/mol;
c) at least one (meth)acrylate monomer or (meth)acrylamide monomer;
d) at least one photoinitiator; and
e) at least one slip agent.

The present invention also relates to a cured product of the photo-curable adhesive composition according to the present disclosure.

The present invention further relates to a process for forming a temporary protective film on a substrate, comprising steps of: a) applying, preferably spray coating the photo-curable adhesive composition according to the present disclosure onto the substrate; and b) exposing the applied substrate to UV light to form a film.

Furthermore, the present invention also relates to the use of the photo-curable adhesive composition according to the present disclosure or the cured product thereof to form a temporary protective film.

DETAILED DESCRIPTION OF THE DISCLOSURE

In the following passages the present disclosure is described in more detail. Each aspect so described may be combined with any other aspect or aspects unless clearly indicated to the contrary. In particular, any feature indicated as being preferred or advantageous may be combined with any other feature or features indicated as being preferred or advantageous.

In the context of the present disclosure, the terms used are to be construed in accordance with the following definitions, unless a context dictates otherwise.

As used herein, the singular forms "a", "an" and "the" include both singular and plural referents unless the context clearly dictates otherwise.

The terms "comprising", "comprises" and "comprised of" as used herein are synonymous with "including", "includes" or "containing", "contains", and are inclusive or open-ended and do not exclude additional, non-recited members, elements or process steps.

The recitation of numerical end points includes all numbers and fractions subsumed within the respective ranges, as well as the recited end points.

The terms "photo-curable adhesive composition", "adhesive composition", "adhesive" and "composition" may be interchangeably used.

Unless otherwise defined, all terms used in the disclosing the disclosure, including technical and scientific terms, have the meaning as commonly understood by one of the ordinary skill in the art to which this disclosure belongs to. By means of further guidance, term definitions are included to better appreciate the teaching of the present disclosure.

The term "polymer" means a macromolecular compound composed of repeated units of the same or different types. The term "polymer" includes homopolymers and copolymers. The term "copolymer" should be understood as a polymer derived from two or more monomers, that is to say, the term "copolymer" includes bipolymers, terpolymers, tetrapolymers and so on. Also, the terms "monomer" according to the disclosure is distinguished from a polymer, and means a compound having a weight average molecular weight of 2,000 or less. In the specification, a polymerizable compound indicates a compound having a polymerizable group and may be a monomer or a polymer. The polymerizable group denotes a group which may be involved in a polymerization reaction.

Unless specially indicated, all materials and agents used in the present disclosure are commercially available.

The photo-curable adhesive composition is liquid and suitable for spray coating, enabling an even and conformal distribution of the adhesive composition over the substrates. The inventors surprisingly found that the film formed by the adhesive composition according to the present invention has a sufficient adhesion with the substrate during assembling and processing, and meanwhile, the film is easy to be released without damaging the substrate after use, such as leaving dimples or random dots on the substrate. In addition, the film exhibits good optical properties (such as high transmittance and low haze) so as to facilitate in-process inspection of the underneath electronic elements during assembling and processing. Furthermore, the adhesive composition is solvent-free, environmentally-friendly, rapid curable and water-resistant.

A photo-curable adhesive composition according to the present invention comprises a) a hydrophobic urethane (meth)acrylate polymer A having a weight average molecular weight of 35000 to 60000 g/mol; b) a hydrophobic urethane (meth)acrylate polymer B having a weight average molecular weight of 5000 to 25000 g/mol; c) at least one (meth)acrylate monomer or (meth)acrylamide monomer; d) at least one photoinitiator; and e) at least one slip agent.

Each component in the composition of the present disclosure will be described in detail below.

Hydrophobic Urethane (meth)acrylate Polymers

The photo-curable adhesive composition comprises at least two hydrophobic urethane (meth)acrylate polymers with different weight average molecular weights (Mws). The hydrophobic urethane (meth)acrylate polymers are used to provide the composition of the present disclosure with good cohesion and elongation.

The term "hydrophobic" means that except the urethane group and acrylic group, the hydrogen atoms in the "—C—H—" units of the urethane (meth)acrylate polymer are not substituted by hydrophilic groups (such as hydroxyl group, carboxyl group and carbonyl group). Hydrophobic urethane (meth)acrylate polymers may impart water resistance to the composition and the cured film thus forming.

Hydrophobic urethane (meth)acrylate polymer A has a weight average molecular weight (Mw) of 35000 to 60000 g/mol, measured by gel permeation chromatography (GPC) method. With the Mw falling within this range, hydrophobic urethane (meth)acrylate polymer A may provide strong cohesion and high elongation.

Preferably, hydrophobic urethane (meth)acrylate polymer A has a functionality of (meth)acrylate group of equal to or less than 2. With the functionality of (meth)acrylate group falling within this range, the cured film may be flexible and easy to be peeled away, Preferably, hydrophobic urethane (meth)acrylate polymer A has a glass transition temperature value (hereafter referred to as "Tg") from −60° C. to 20° C. Tg can be determined by differential scanning calorimetry (DSC). With the Tg falling within this range, hydrophobic urethane (meth)acrylate polymer A offers good flexibility to cured adhesives.

The amount of hydrophobic urethane (meth)acrylate polymer A in the photo-curable adhesive composition of the present disclosure is preferably from 5 to 40% by weight based on the total weight of the composition, more preferably from 8 to 20% by weight, and even more preferably from 8 to 15% by weight.

Preferably, hydrophobic urethane (meth)acrylate polymer B has a similar structure with that of hydrophobic urethane (meth)acrylate polymer A. They differ from each other by Mw.

Hydrophobic urethane (meth)acrylate polymer B has a weight average molecular weight (Mw) of 5000 to 25000 g/mol, measured by gel permeation chromatography (GPC) method. With the Mw falling within this range, hydrophobic urethane (meth)acrylate polymer B can be used to decrease the viscosity of the composition, in order to facilitate the application of the composition and ensure that the composition is not too thick to block the nozzles of sprayer during application. The low molecular weight polymer B may decrease the peeling strength of high molecular weight polymer A to a suitable level, which further makes the cured adhesive peelable as a film from substrates without break or crack.

Preferably, hydrophobic urethane (meth)acrylate polymer B has a functionality of (meth)acrylate group equal to or less than 2. With the functionality of (meth)acrylate group falling within this range, the cured film is flexible and easy to be peeled away.

Preferably, hydrophobic urethane (meth)acrylate polymer B has a Tg value of from −60° C. to 0° C. Tg can be determined by differential scanning calorimetry (DSC). With the Tg falling within this range, hydrophobic urethane (meth)acrylate polymer B may offer good flexibility to cured adhesives.

The amount of hydrophobic urethane (meth)acrylate polymer B in the photo-curable adhesive composition of the disclosure is preferably from 10 to 40% by weight based on the total weight of the composition, more preferably from 15 to 35% by weight, and even more preferably from 15 to 30% by weight.

Hydrophobic urethane (meth)acrylate polymers A and B can be independently selected from the group consisting of aliphatic urethane (meth)acrylates, aromatic urethane (meth)acrylates and mixtures thereof; more preferably selected from the group consisting of hydrogenated polybutadiene based urethane (meth)acrylates, polyisobutylene based urethane (meth)acrylates, polyisoprene based urethane (meth)acrylate, polybutyl rubber based urethane (meth)acrylates and the mixtures thereof.

Suitable commercially available hydrophobic urethane (meth)acrylate polymers A for use in the present invention include, but are not limited to UT-4462 available from Nippon Gohsei, and UV36301B90 available from Nippon Gohsei. Suitable commercially available hydrophobic urethane (meth)acrylate polymers B for use in the present invention include, but are not limited to CN 9014 available from Sartomer, and SUO-H8628 available from SHIIN-A T&C.

(Meth)acrylate Monomer or (meth)acrylamide Monomer

The photo-curable adhesive composition according to the present invention comprises at least one (meth)acrylate monomer or (meth)acrylamide monomer. (Meth)acrylate monomer or (meth)acrylamide monomer may be used to decrease the viscosity of the composition to a low level, such as no more than 1500 mPa·s (Brookfield viscosity), in order to facilitate the application of the adhesive, especially facilitate spray coating.

In the specification, the term "(meth)acrylate" refer to both or either of acrylate and methacrylate, the term "(meth)acryl" represents both or either of acryl and methacryl, the term "(meth)acryloyl" represents both or either of acryloyl and methacryloyl, and the term "(meth)acryamide" represents both or either of acrylamide and methacrylamide.

Preferably, the (meth)acrylate monomer or (meth)acrylamide monomer is a mono-functional or di-functional (meth)acrylate monomer. Compared with (meth)acrylate monomer or (meth)acrylamide monomer having a functionality of three or more, mono-functional or di-functional (meth)acrylate monomer or (meth)acrylamide monomer may have a lower crosslinking density, and higher elongation after curing, which makes the cured product formed by the composition easy to be released as a film.

In an embodiment according to the present invention, the (meth)acrylate monomer or (meth)acrylamide monomer has a weight average molecular weight (Mw) of 2,000 or less.

Preferably, the (meth)acrylate monomer or (meth)acrylamide monomer has a Tg value no less than 40° C., preferably no less than 60° C., more preferably no less than 80° C. Tg can be determined by differential scanning calorimetry (DSC). With the Tg following within this range. The cured film formed by the composition is not undesirably tacky on the surface. It may reduce the peeling strength and ensure the film to be released easily from the protected substrates.

There is no specific limitation to the (meth)acrylate monomer or (meth)acrylamide monomer, and those commonly used in adhesives can be used. Preferably, the (meth)acrylate monomer or (meth)acrylamide monomer is selected from the group consisting of butyl (meth)acrylate, isobornyl (meth)acrylate, 4-acryloyl morpholine, hexanediol diacrylate, ethyleneglycol diacrylate, tricyclodecane dimethanol diacrylate, and mixtures thereof.

Suitable commercially available (meth)acrylate monomers or (meth)acrylamide monomers for use in the present invention include, but are not limited to SR 506, SR 833 and SR 395 available from Sartomer.

The amount of the (meth)acrylate monomer or (meth) acrylamide monomer in the photo-curable adhesive composition according to the present invention is preferably from 30 to 70% by weight based on the total weight of the composition, more preferably from 35 to 65% by weight, and even more preferably from 50 to 60% by weight.

Photoinitiator

The photo-curable adhesive composition according to the present invention comprises at least one photoinitiator. The photoinitiator may initiate and accelerate the crosslinking of the hydrophobic urethane (meth)acrylate polymers and the (meth)acrylate monomer upon exposure to UV light. By employing the photoinitiator, the composition according to the present invention may cure rapidly in less than 1 minute, preferably in tens of seconds, and more preferably in 1 to 10 seconds.

During UV curing of acrylates, there is a surface cure problem of oxygen polymerization inhibition, which leads to undesired tacky film after cured. Preferably, the used photoinitiator is cleavage type photoinitiator, which prevents the aforementioned surface cure problem.

Preferably, the photoinitiator is alpha-amino-ketone type initiators, or aromatic ketone type initiators. Preferably, the photoinitiator is selected from the group consisting of 2-benzyl-2-dimethylamino-1-(4-morpholinophenyl)-1-butanone, 2-methyl-1-[4-(methylthio)phenyl]-2-(4-morpholinyl)-1-propanone, 2-dimethylamino-2-(4-methyl-benzyl)-1-(4-morpholin-4-yl-phenyl)-butan-1-one, 2-hydroxy-1-{4-[4-(2-hydroxy-2-methyl-propionyl)-benzyl]-phenyl}-2-methyl-propan-1-one, and combination thereof. These photoinitiators provide good surface cure properties.

Suitable commercially available photoinitiators for use in the present invention include, but are not limited to Irgacure 369, Irgacure 907, Irgacure 379, Irgacure 184, Irgacure 500, Irgacure 127 and Irgacure MBF available from BASF.

Preferably, the photo-curable adhesive composition according to the present invention comprises two or more photoinitiators, in order that the UV absorption cover wide wavelengths of UVC (200-280 nm) and UVB (280-320 nm), which may enhance surface curing and make cured film tacky-free.

The total amount of the photoinitiators in the composition according to the present invention is preferably from 1 to 10% by weight based on the total weight of the composition, more preferably from 2 to 8%, and even more preferably from 3 to 7%. Photoinitiators in such high concentrations may help to solve the aforementioned surface curing problem.

Slip Agent

The photo-curable adhesive composition according to the present invention comprises at least one slip agent. The slip agent is used to reduce the coefficient of friction (COF) while maintaining good optical properties such as high transparency and low haze.

Preferably, the slip agent is UV-curable, in order to reduce the peeling strength of the cured film while participating the photopolymerization.

Preferably, the slip agent is compatible with other components of the composition, in order to impart good optical properties to the film formed from the composition according to the present invention.

Slip agents suitable for use in the composition according to the present invention are preferably an acrylate functional polydimethylsiloxane, more preferably a polyether modified acrylate functional polydimethylsiloxane.

Suitable commercially available slip agents for use in the present invention include, but are not limited to BYK-310, BYK-378, BYK-320, BYK-300, BYK-3500, BYK-3505, BYK-333 available from BYK Chemie.

The amount of the slip agent in the photo-curable adhesive composition according to the present disclosure is preferably from 0.5 to 5% by weight based on the total weight of the composition, more preferably from 1 to 2.5%, and even more preferably from 1.5 to 2%.

Optional Additives

Optionally, the composition according to the present invention may further comprise additional components to improve and/or modify properties such as flowability, dispensing property, storage property and curing property of the composition, and physical or mechanical property of the film obtained from the composition.

The optional additives may include those commonly used in photo curable adhesives, and their contents are also known to a person skilled in the art. In some examples, the optional additives that may be contained in the composition as needed may include but are not limited to photosensitizers, wetting agents, adhesive promoters, organic or inorganic fillers, thixotropic agents, silane coupling agents, solvents, colouring agents such as pigments and dyes, stabilizers, defoamers, levelling agents, UV tracers and the like.

In one embodiment according to the present invention the photo-curable adhesive composition may further comprise at least one defoamer. The defoamer may be used to reduce the formation of bubbles during curing. There is no specific limitation to the defoamer, and those commonly used in adhesives may be used. Preferably, the defoamer is selected from commercially available products BYK-060 N, BYK-070, BYK-088, and BYK-A530 from BYK Chemie.

In one embodiment according to the present invention the photo-curable adhesive composition may further comprise one or more stabilizers. According to the present invention, the term "stabilizer" has the same meaning as the term "antioxidant" and they can be used interchangeably. There is no specific limitation to the stabilizer, and those commonly used in adhesives may be used.

Stabilizers suitable to be utilized in the present invention include hindered phenols and multifunctional phenols such as sulphur and phosphorous containing phenols. Exemplary hindered phenols include 1,3,5-trimethyl-2,4,6-tris(3,5-di-tert-butyl-4-hydroxybenzyl)benzene, pentaerythrityl tetrakis-3(3,5-ditert-butyl-4-hydroxybenzyl)propionate, n-octadecyl-3(3,5-ditert-butyl-4-hydroxybenzyl)propionate, 4,4'-methylene bis(2,6-tert-butylphenol), 4,4'-thiobis-(6-tert-butyl-o-cresol), 2,6-tert-butylphenol, 6-(4-hydroxyphenoxy) 2,4-bis(n-octyl-thio)-1,3,5-triazine, di-n-octadecyl 3,5-ditert-butyl-4-hydroxy-benzylphosphonate, 2-(n-octylthio) ethyl 3,5-di-tert-butyl-4-hydroxy-benzoate and sorbitol hexa-[(3-(3,5-ditert-butyl-4-hydroxylphenyl)-propionate].

The photo-curable adhesive composition of the disclosure may comprise one or more stabilizers. Suitable commercially available stabilizers or antioxidants for use in the present invention include, but are not limited to Irganox® 1010, Irganox® 1076 and Irganox® 168 from BASF.

In one embodiment according to the present invention the photo-curable adhesive composition may further comprise one or more fillers. There is no specific limitation to the filler, and those commonly used in adhesives may be used.

Examples of suitable fillers include organic or inorganic particles, including calcium carbonate, silica, clays, talc, titanium dioxide, zeolites, powdered metals, organic or inorganic fibres (including carbon fibres, silicon nitride fibre), steel wire or mesh, and nylon or polyester cord, and the like.

Photo-Curable Adhesive Composition

In one embodiment according to the present invention, the photo-curable adhesive composition comprises:
- a) from 5 to 40% by weight, preferably from 8 to 15% by weight of a hydrophobic urethane (meth)acrylate polymer A, having a weight average molecular weight of 35000 to 60000 g/mol;
- b) from 10 to 40% by weight, preferably from 15 to 30% by weight of a hydrophobic urethane (meth)acrylate polymer B, having a weight average molecular weight of 5000 to 25000 g/mol;
- c) from 30 to 70% by weight, preferably from 50 to 60% by weight of a (meth)acrylate monomer or (meth)acrylamide monomer;
- d) from 1 to 10% by weight, preferably from 3 to 7% by weight of a photo initiator;
- e) from 0.5 to 5% by weight, preferably from 1 to 2.5% by weight of a slip agent; and
- f) optionally from 0.5 to 1% by weight of a defoamer; based on the total weight of the composition.

In one embodiment according to the present invention, the photo-curable adhesive composition comprises:
- a) from 5 to 40% by weight, preferably from 8 to 15% by weight of a hydrophobic urethane (meth)acrylate polymer A, having a weight average molecular weight of 35000 to 60000 g/mol;
- b) from 10 to 40% by weight, preferably from 15 to 30% by weight of a hydrophobic urethane (meth)acrylate polymer B, having a weight average molecular weight of 5000 to 25000 g/mol;
- c) from 30 to 70% by weight, preferably from 50 to 60% by weight of a (meth)acrylate monomer or (meth)acrylamide monomer;
- d) from 1 to 10% by weight, preferably from 3 to 7% by weight of a photoinitiator; and
- e) from 0.5 to 5% by weight, preferably from 1 to 2.5% by weight of a slip agent; based on the total weight of the composition.

The Brookfield viscosity of the adhesive composition according to the present invention is from 100 to 2500 mPa·s at 25° C., preferably from 300 to 1500 mPa·s at 25° C. Viscosity within these ranges facilitates the application of the adhesive, especially suitable for spray coating. The viscosity test method is described in the examples section.

The hardness of the cured adhesive composition according to the present invention is not less than ShA 50, preferably not less than ShA 65. Such hardness may ensure sufficient abrasion resistance of the cured film. The hardness test method is described in the examples section.

Preferably, the transmittance of the cured adhesive composition according to the present invention is more than 95%, preferably more than 97%, which facilitates visual inspection of the underneath electronic elements during assembling and processing. The transmittance test method is described in the examples section.

The haze of the cured adhesive composition according to the present invention is not more than 3.0%, preferably not more than 1.0%, which facilitates visual inspection of the underneath electronic elements during assembling and processing. The haze test method is described in the examples section.

The yellowing index b* of the cured adhesive composition is not more than 20, preferably not more than 15.0. The yellowing index b* test method is described in the examples section.

For cured film with a thickness of 60 micron, the elongation at break is not less than 60%, preferably not less than 100%, which ensures good peelability of the cured film. The elongation at break test method is described in the examples section.

The 180° peeling strength (60 micron thickness) is less than 1.5 N/cm, preferably less than 1.0 N/cm, which ensures good peelability of the cured film without causing damage to the underneath substrate. The peeling strength test method is described in the examples section.

When dipping the substrate with cured film (60 micron thickness) applied thereon into water at room temperature (about 25° C.) to conduct the water resistance test, there is no defects in 24 hours, preferably no defects in 72 hours. The water resistance test method is described in the examples section.

Preparation of Adhesive Composition

The adhesive composition of the present disclosure can be prepared by mixing each component through any suitable method and in any suitable order. The components can be mixed continuously or discontinuously. The components can be stirred during mixing, if necessary. The stirring speed may be constant throughout the whole mixing step or can vary during different stages of mixing.

It is preferable to add the photoinitiator after introducing all other components, so as to avoid undesirable polymerization. Preferably, the adhesive composition is prepared and stored under light-proof conditions. There is no specific limitation to the mixing time, which may be adjusted according to actual requirements. Preferably, the mixing temperature may be below 60° C.

Method for Forming Temporary Protective Film

The present invention also provides a process for forming a temporary protective film on a substrate, comprising steps of: a) applying, preferably spray coating the photo-curable adhesive composition according to the present invention onto the substrate; and b) exposing the coated substrate to UV light to form a film.

In addition to spray coating, other conventional coating methods may be employed to apply the composition according to the present invention, such as slip coating, roller coating, inject coating, spin coating and cast coating. It is preferred to employ spraying coating method, which makes it possible to form an even and conformal film onto the substrate.

In some embodiments, the adhesive composition may be applied onto the outer shells of electronic devices, such as the outer shells of smartphones, tablet computers and monitors. Suitable substrates may be made from various kinds of materials, such as aluminium alloy (such as aluminium-mottled cast iron), molybdenum, stainless steel and aluminium oxide.

The wet thickness of the applied composition is preferably from 10 μm to 2 mm, preferably from 15 μm to 1 mm, more preferably from 20 to 300 μm, most preferably from 20 to 100 μm.

Suitable UV sources (such as electromagnetic radiation) for use in the present invention include those that may emit UV light having a wavelength from 200 nm to 500 nm, such as UVALOC1000 available from Loctite Company; and high pressure mercury lamp which at least emits UVA light (wavelength: from 320 to 400 nm). The irradiation energy may be 3000 mJ/cm$^2$ or more, irradiation power may be about 100 mW/cm$^2$, and irradiation time may be 30 seconds or more.

The cured film formed from the photo-curable adhesive composition according to the present invention can be easily peeled away after use, without damage or contamination (such as dimples or random dots) to the substrate.

The photo-curable adhesive composition or the cured product can be used to form a temporary protective film, preferably for an electronic assembly, such as a cosmetic surface protection for mobile phones and tablet computers during assembling process, and protection from secondary machining.

EXAMPLES

The present disclosure will be further described and illustrated in detail with reference to the following examples. The examples are intended to assist one skilled in the art to better understand and practice the present disclosure, however, are not intended to restrict the scope of the present disclosure. Unless otherwise specified, all preparation and test experiments are conducted at room temperature and atmospheric pressure.

Materials

UT-4462: urethane acrylate polymer A, Mw=50,000, Tg=−45° C., available from Nippon Gohsei. UV3630IB90: urethane acrylate polymer A, Mw=50,000, Tg=−45° C., available from Nippon Gohsei.

CN 9014: urethane acrylate polymer B, Mw=23,000, Tg=−31° C., available from Sartomer. SUO-H8628: urethane acrylate polymer B, Mw=6,000, Tg=−38° C., available from SHIN-A T&C.

SR 506: isobornyl acrylate, (meth)acrylate monomer, Mw=208, Tg=94° C., available from Sartomer.

SR 833: tricyclodecane dimethanol diacrylate, Mw=304, Tg=185° C., available from Sartomer.

SR-395: isodecyl acrylate, Mw=212, Tg=−60° C., available from Sartomer.

BYK-3500: Polyether-modified acrylate functional polydimethylsiloxane, slip agent, available from BYK Chemie.

BYK-088: a solution of foam destroying polymers and polysiloxanes, defoamer, available from BYK Chemie.

BYK-333: Polyether-modified polydimethylsiloxane, slip agent, available from BYK Chemie. Irgacure 369: 2-Benzyl-2-dimethylamino-1-(4-morpholinophenyl)-1-butanone, photoinitiator, available from BASF.

Irgacure 379: 2-Dimethylamino-2-(4-methyl-benzyl)-1-(4-morpholin-4-yl-phenyl)-butan-1-one, photoinitiator, available from BASF.

Irgacure 907: 2-Methyl-1-[4-(methylthio)phenyl]-2-(4-morpholinyl)-1-propanone photoinitiator, available from BASF. Irgacure MBF: methylbenzoylformate, photoinitiator, available from BASF.

Irgacure 127: 2-Hydroxy-1-{4-[4-(2-hydroxy-2-methyl-propionyl)-benzyl]-phenyl}-2-methyl-propan-1-one, photoinitiator, available from BASF.

Test Methods

Viscosity

The viscosity was measured with a Brookfield DV-II+Pro viscometer with spindle #52 at 100 rpm, room temperature (RT, 25° C.), according to ASTM D1084.

Hardness

The hardness was measured by using Durometer according to ASTM D2240. A stack of three adhesives was tested, wherein each adhesive has a wet thickness of 3 mm.

Transmittance, Haze and Yellowing Index, b* Value

The visible light transmittance, haze and yellowing Index, b* value of the adhesive composition after curing was measured by using an ultraviolet-visible spectrometer (Cary 300, available from Varian, America) according to ASTM D1003-2007. The wet thickness of the adhesive was controlled as 100 microns between 2 pieces of Gorilla Glasses from Corning USA.

Elongation at Break

Elongation at break was measured by using an MTS Universal test machine. The adhesive sample was produced by dropping the adhesive composition onto a releasable film to a given size: thickness being 60 microns, width being 20 mm and length being 100 mm.

180° Peeling Strength

Peeling strength was measured according to ASTM D903. The adhesive sample was produced by dropping the adhesive composition to a given size (thickness: 60 microns, width: 25 mm, length: 25 cm) onto an anodized aluminium oxide foil. The adhesive was cured on the anodized aluminium oxide foil with 8,000 mJ/cm$^2$ UVA (with UVALOCA1000, lamp intensity 250 mW/cm$^2$) before being peeling.

Water Resistance

A liquid adhesive sample with a gap thickness at 60 microns was cured on an anodized aluminium oxide foil with 8,000 mJ/cm$^2$ UVA (with UVALOCA1000, lamp intensity 250 mW/cm$^2$). The obtained specimen was fully dipped into water for 24 hours and 72 hours under 25° C., respectively, so as to observe whether delamination or defects occur when pulling the specimen out of the water.

Peelable Test

A liquid adhesive sample with a gap thickness at 60 microns was coated on an anodized aluminium oxide foil (25 mm*100 mm*1 mm), then the adhesive was cured with 8,000 mJ/cm$^2$ UVA (with UVALOCA1000, lamp intensity 250 mW/cm$^2$). By adhering a 3M transparent single tape (Model: CIP18) onto the cured adhesive film, the peelable performance was evaluated as to whether a film could be peeled from the anodized aluminium oxide film.

Example 1

Examples 1 to 5 having the formulations as shown in Table 1 below were prepared by the following procedure: Each ingredient was separately weighed out at room temperature, and then charged into a Labtop 3LAPC planet stirrer (manufactured by Labsystem Corporation) and stirred for 1.5 hour at a speed of about 100 rpm to make sure all solid materials were well dissolved. Followed by stirring the mixture for additional 10 minutes. Subsequently, the mixture was deaerated by applying vacuum (5000 Pa) under stirring at a low speed of 20 rpm for approximately 10 minutes.

TABLE 1

Formulations of the adhesive compositions

| Component | Material | Ex. 1 (wt %) | Ex. 2 (wt %) | Ex. 3 (wt %) | Ex. 4 (wt %) | Ex. 5 (wt %) |
|---|---|---|---|---|---|---|
| a) urethane (meth)acrylate polymer A | UT-4462 | 15.0 | 15.0 | 13.0 | | 15.0 |
| | UV3630IB90 | | | | 12.0 | |
| b) urethane (meth)acrylate polymer B | CN 9014 | 23.0 | | 24.0 | 23.0 | 23.0 |
| | SUO-H8628 | | 22.0 | | | |
| c) (meth)acrylate Monomer | SR 506 | 54.0 | 54.0 | 55.5 | 55.6 | 54.5 |
| | SR 833 | | | | 0.4 | |
| d) photoinitiator | Irgacure 369 | 1.0 | | | | 1.0 |
| | Irgacure 907 | 5.0 | 5.0 | | 5.0 | 5.0 |
| | Irgacure 379 | | 1.0 | 1.0 | 1.0 | |
| | Irgacure 127 | | | 2.0 | | |
| | Irgacure MBF | | | 2.0 | | |
| e) slip agent | BYK-3500 | 1.5 | 2.5 | | | 1.5 |
| | BYK-333 | | | 2.0 | 2.5 | |
| f) defoamer | BYK-088 | 0.5 | 0.5 | 0.5 | 0.5 | |
| Total | | 100.0 | 100.0 | 100.0 | 100.0 | 100.0 |

All adhesive compositions in Examples 1 to 5 were tested according to the aforementioned test methods. Test results were recorded in Table 2 below.

TABLE 2

Physical properties of the adhesive compositions and cured films

| | Physical properties | Ex. 1 | Ex. 2 | Ex. 3 | Ex. 4 | Ex. 5 |
|---|---|---|---|---|---|---|
| Uncured compositions | Colour | Transparent and slightly yellowish | Transparent and slightly yellowish | Transparent and slightly yellowish | Transparent and slightly yellowish | Transparent and slightly yellowish |
| | Brookfield Viscosity (mPa · s/25° C.) | around 710 | around 379 | around 560 | around 720 | around 750 |
| Cured films | Peelable test | Pass | Pass | Pass | Pass | Pass |
| | ShA Hardness | 85 | 78 | 67 | 93 | 86 |
| | Transmittance | 99.37% | 99.34% | 98.92% | 99.26% | 99.26% |
| | Haze | 0.103% | 0.155% | 0.384% | 0.166% | 0.092% |
| | Yellowing index, b* | 5.595 | 4.905 | 13.999 | 6.020 | 5.646 |
| | Elongation at break | 172% | 146% | 131% | 126% | 160% |
| | 180° Peeling strength (N/cm) | 0.35 | 0.31 | 0.51 | 0.25 | 0.40 |
| | Water resistance | No delamination or defects in 3 days | No delamination or defects in 3 days | No delamination or defects in 3 days | No delamination or defects in 3 days | No delamination or defects in 3 days |

It can be seen from Tables 1 and 2 that films formed from the adhesive composition according to the present invention had a sufficient adhesion with the substrate during assembling and processing, and meanwhile, the films were easy to be released without damaging the substrate. In addition, the film exhibited good optical properties (such as high transmittance and low haze), which facilitated in-process inspection of the underneath electronic elements during assembling and processing.

TABLE 3

Formulations of the comparative adhesive compositions

| Component | Material | Ex. 1 (wt %) | Com Ex. 1 (wt %) | Com Ex. 2 (wt %) | Com Ex. 3 (wt %) |
|---|---|---|---|---|---|
| a) urethane acrylate polymer A | UT-4462 UV3630IB90 | 15.0 | 15.0 | 15.0 | 38.0 |
| b) urethane acrylate polymer B | CN 9014 SUO-H8628 | 23.0 | 23.0 | 23.0 | 0 |
| c) (meth)acrylate monomer | SR 506 SR 833 SR 395 | 54.0 | 54.0 | 55.5 | 54.0 |
| d) photoinitiator | Irgacure 369 Irgacure 907 Irgacure 379 Irgacure 127 Irgacure MBF | 1.0 5.0 | 1.0 5.0 | 1.0 5.0 | 1.0 5.0 |
| e) slip agent | BYK-3500 BYK-333 | 1.5 | 1.5 | 0 | 1.5 |
| f) defoamer | BYK-088 | 0.5 | 0.5 | 0.5 | 0.5 |
| Total | | 100.0 | 100.0 | 100.0 | 100.0 |

TABLE 4

Physical properties of the comparative adhesive compositions and cured films

| | Physical properties | Ex. 1 | Com Ex. 1 (wt %) | Com Ex. 2 (wt %) | Com Ex. 3 (wt %) |
|---|---|---|---|---|---|
| Uncured compositions | Colour | Transparent and slightly yellowish | Transparent and slightly yellowish | Transparent and slightly yellowish | Transparent and slightly yellowish |
| | Brookfield Viscosity (mPa · s/25° C.) | around 710 | around 560 | around 660 | around 560 |
| Cured films | Peelable test | Pass | Fail | Fail | Fail |

It can be seen from Tables 3 and 4 that when (meth)acrylate monomer in Comparative Example 1 had a low Tg (−60° C.), the cured film could not be peeled away as a whole film. Similarly, when no slip agent was employed in Comparative Example 2, or when no low molecular urethane (meth)acrylate polymer B was employed in Comparative Example 3, the cured film could not be peeled away as a whole film, either.

These and other modifications and variations of the present invention may be practiced by those of ordinary skill in the art, without departing from the spirit and scope of the present invention. In addition, it should be understood that aspects of the various embodiments may be interchanged either in whole or in component. Furthermore, those of ordinary skill in the art will appreciate that the foregoing description is by way of example only and is not intended to limit the invention so further described in such appended claims.

What is claimed is:

1. A photo-curable adhesive composition, comprising:
   a) a hydrophobic urethane (meth)acrylate polymer A having a weight average molecular weight of 35000 to 60000 g/mol;
   b) a hydrophobic urethane (meth)acrylate polymer B having a weight average molecular weight of 5000 to 25000 g/mol;
   c) at least one (meth)acrylate monomer or (meth)acrylamide monomer;
   d) at least one photoinitiator; and
   e) at least one slip agent.

2. The photo-curable adhesive composition according to claim 1, wherein hydrophobic urethane acrylate polymers A and B are independently selected from the group consisting of aliphatic urethane (meth)acrylates, aromatic urethane (meth)acrylates and mixtures thereof.

3. The photo-curable adhesive composition according to claim 1, comprising hydrophobic urethane (meth)acrylate polymer A in an amount from 5 to 40% by weight based on the total weight of the composition.

4. The photo-curable adhesive composition according to claim 1, comprising hydrophobic urethane (meth)acrylate polymer B in an amount from 10 to 40% by weight based on the total weight of the composition.

5. The photo-curable adhesive composition according to claim 1, wherein said (meth)acrylate monomer or (meth)acrylamide monomer is a mono-functional or di-functional (meth)acrylate monomer or (meth)acrylamide monomer having a glass transition temperature no less than 40° C.

6. The photo-curable adhesive composition according to claim 1, comprising the (meth)acrylate monomer or (meth)acrylamide monomer in an amount from 30 to 70% by weight based on the total weight of the composition.

7. The photo-curable adhesive composition according to claim 1, comprising the photoinitiator in an amount from 1 to 10% by weight based on the total weight of the composition.

8. The photo-curable adhesive composition according to claim 1, comprising at least two photoinitiators.

9. The photo-curable adhesive composition according to claim 1, wherein said slip agent is an acrylate functional polydimethylsiloxane.

10. The photo-curable adhesive composition according to claim 1, comprising the slip agent in an amount from 0.5 to 5% by weight based on the total weight of the composition.

11. The photo-curable adhesive composition according to claim 1, further comprising at least one defoamer.

12. The photo-curable adhesive composition according to claim 1, comprising:
   a) from 5 to 40% by weight of a hydrophobic urethane (meth)acrylate polymer A, having a weight average molecular weight of 35000 to 60000 g/mol;
   b) from 10 to 40% by weight of a hydrophobic urethane (meth)acrylate polymer B, having a weight average molecular weight of 5000 to 25000 g/mol;
   c) from 30 to 70% by weight of a (meth)acrylate monomer or (meth)acrylamide monomer;
   d) from 1 to 10% by weight of a photoinitiator;
   e) from 0.5 to 5% by weight of a slip agent; and
   f) optionally from 0.5 to 1% by weight of a defoamer;
   based on the total weight of the composition.

13. A cured product of the photo-curable adhesive composition according to claim 1.

14. A process for forming a temporary protective film on a substrate, comprising steps of: a) applying the photo-curable adhesive composition according to claim 1 onto the substrate; and b) exposing the applied substrate to UV light to form a film.

15. The photo-curable adhesive composition according to claim 12, wherein the hydrophobic urethane (meth)acrylate polymer A is present in an amount from 8 to 15% by weight.

16. The photo-curable adhesive composition according to claim 12, wherein the hydrophobic urethane (meth)acrylate polymer B is present in an amount from 15 to 30% by weight.

17. The photo-curable adhesive composition according to claim 12, wherein the (meth)acrylate monomer or (meth)acrylamide monomer is present in an amount from 50 to 60% by weight.

18. The photo-curable adhesive composition according to claim 12, wherein the photoinitiator is present in an amount from 3 to 7% by weight.

19. The photo-curable adhesive composition according to claim 12, wherein the slip agent is present in an amount from 1 to 2.5% by weight.

* * * * *